United States Patent
Merritt

(10) Patent No.: US 6,192,002 B1
(45) Date of Patent: Feb. 20, 2001

(54) MEMORY DEVICE WITH COMMAND BUFFER

(75) Inventor: Todd A. Merritt, Boise, ID (US)

(73) Assignee: Micron Technology, Boise, ID (US)

( * ) Notice: Under 35 U.S.C. 154(b), the term of this patent shall be extended for 0 days.

(21) Appl. No.: 09/143,173

(22) Filed: Aug. 28, 1998

(51) Int. Cl.[7] ........................... G11C 8/00
(52) U.S. Cl. ............. 365/233; 365/230.01; 365/230.03; 365/236; 365/189.01; 365/189.04
(58) Field of Search ................. 365/189.01, 189.05, 365/230.01, 230.03, 233, 236, 189.04

(56) References Cited

U.S. PATENT DOCUMENTS

| | | | |
|---|---|---|---|
| 5,655,105 | * 8/1997 | McLaury | 395/496 |
| 5,657,287 | * 8/1997 | McLaury et al. | 365/230.01 |
| 5,813,023 | * 9/1998 | McLaury | 711/105 |
| 5,901,111 | * 5/1999 | McLaury et al. | 365/236 |
| 6,006,290 | * 12/1999 | Suh | 710/35 |
| 6,026,496 | * 2/2000 | Wright et al. | 713/500 |
| 6,097,781 | * 8/2000 | Wright et al. | 377/26 |

* cited by examiner

*Primary Examiner*—Viet Q. Nguyen
(74) *Attorney, Agent, or Firm*—Williams, Morgan & Amerson, P.C.

(57) ABSTRACT

A memory device includes a memory array, an external clock terminal, and control logic. The memory array is arranged in rows and columns. The external clock terminal is adapted to receive an external clock signal. The external clock signal has at least a first cycle and a second cycle. The first cycle includes a first edge and the second cycle includes a second edge. The control logic is coupled to the memory array and the external clock terminal and adapted to write to a first plurality of the columns in a specified row during the first and second cycles. The control logic is further adapted to suspend the external clock signal to suppress the second edge of the second cycle while writing to the first plurality of the columns. A method for accessing a memory device arranged in rows and columns is provided. The method includes receiving an external clock signal. The external clock signal has at least a first cycle and a second cycle. The first cycle includes a first edge and the second cycle includes a second edge. A first plurality of columns in a specified row are written to during the first and second cycles. The external clock signal is suspended to suppress the second edge of the second cycle while writing to the first plurality of the columns.

31 Claims, 4 Drawing Sheets

MEMORY DEVICE WITH COMMAND BUFFER

BACKGROUND OF THE INVENTION

1. Field of the Invention

This invention relates generally to memory devices, and more particularly, to a memory device having the ability to perform block writes in a bursting fashion.

2. Description of the Related Art

Memory devices, such as synchronous graphics random access memories (SGRAM) and synchronous dynamic access memories (SDRAM), have been widely used to enhance the performance of computer systems executing memory intensive applications. SGRAM devices are especially adapted to improving graphics performance, and SDRAM devices fill a more general purposes memory role.

SCRAM devices have been equipped with features tailored to enhance the processing of repetitive tasks that are commonly seen in graphics applications. One such feature used in specialized graphics memories is a block write. During a block write, multiple cells in the graphics memory are simultaneously written with the same value. For example, eight cells may be accessed concurrently. Because of the multiplicity of cells being written, a block write takes more time to complete than a normal single cell write access. Typically, a block write is completed in two clock cycles, as opposed to one clock cycle for a normal write.

In a normal write access, the digit lines associated with the accessed cell are equilibrated prior to the next clock cycle in response to an equilibrate pulse. Subsequent accesses are typically performed in a bursting fashion, where internal counters for incrementing the column or row being accessed within the memory device are toggled every cycle. Because the counters are incremented during the block write, they no longer point to the desired next column or row.

Both of these situations pose problems for a block write that takes multiple cycles to complete. If an equilibrate pulse is received during a block write, the data being written would be compromised. Accordingly, specialized logic is used to inhibit the equilibrate pulse for any clock cycles occurring during the block write. To address the counter synchronization issue, a storage device (e.g., register) is used to store the column counter and restore the counter to the proper value after completion of the block write. Both of these solutions increase the complexity and size of the graphics memory, thus increasing its cost. Due to the clock synchronization problem inherent in the block write, bursting of block writes is not achievable. General purpose memory devices, such as SDRAM devices, are not typically equipped with block write functionality.

The present invention is directed to overcoming, or at least reducing the effects of, one or more of the problems set forth above.

SUMMARY OF THE INVENTION

One aspect of the present invention is seen in a memory device including a memory array, an external clock terminal, and control logic. The memory array is arranged in rows and columns. The external clock terminal is adapted to receive an external clock signal. The external clock signal has at least a first cycle and a second cycle. The first cycle includes a first edge and the second cycle includes a second edge. The control logic is coupled to the memory array and the external clock terminal and adapted to write to a first plurality of the columns in a specified row during the first and second cycles. The control logic is further adapted to suspend the external clock signal to suppress the second edge of the second cycle while writing to the first plurality of the columns.

Another aspect of the present invention is seen in a method for accessing a memory device arranged in rows and columns. The method includes receiving an external clock signal. The external clock signal has at least a first cycle and a second cycle. The first cycle includes a first edge and the second cycle includes a second edge. A first plurality of columns in a specified row are written to during the first and second cycles. The external clock signal is suspended to suppress the second edge of the second cycle while writing to the first plurality of the columns.

BRIEF DESCRIPTION OF THE DRAWINGS

Other objects and advantages of the invention will become apparent upon reading the following detailed description and upon reference to the drawings in which.

Figure 1:
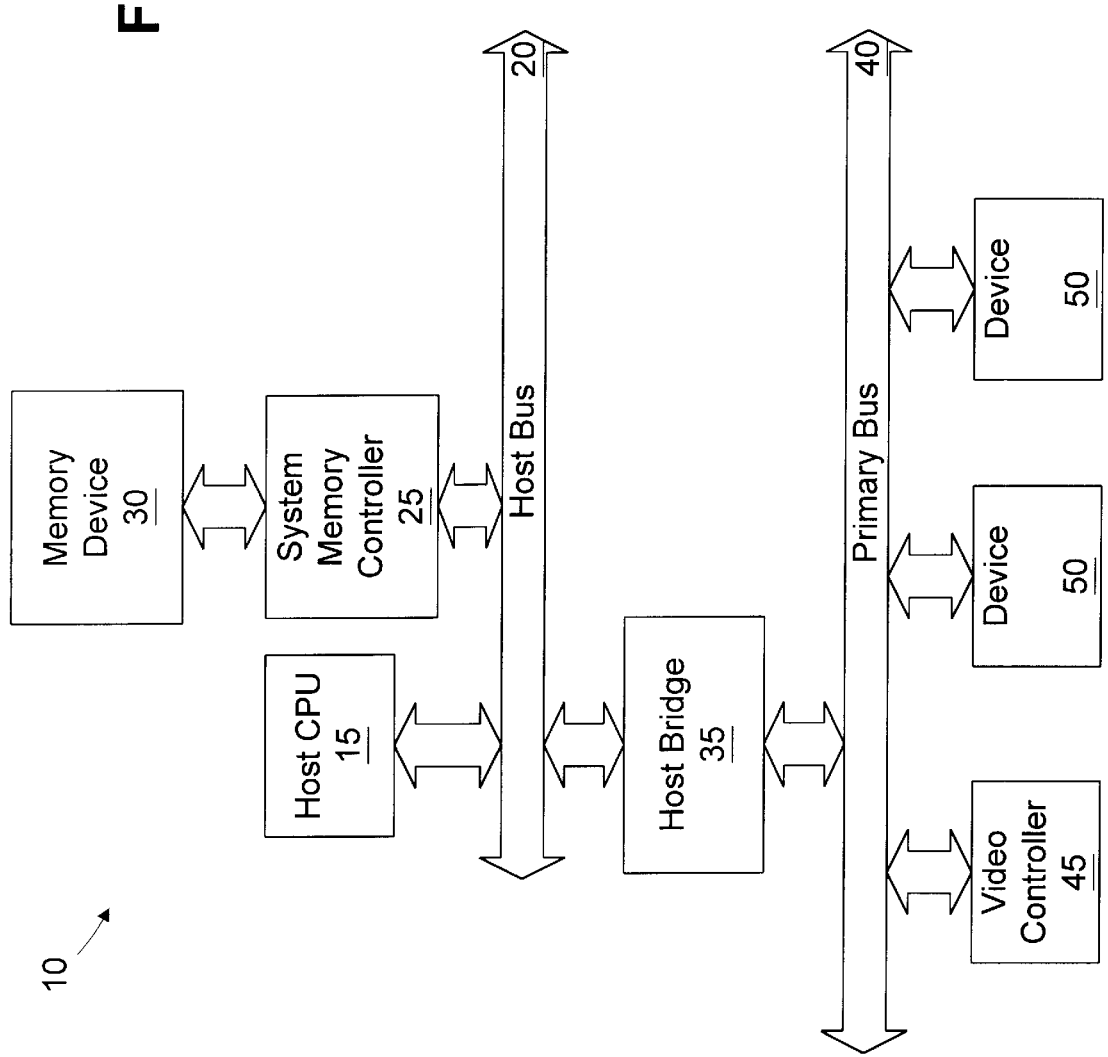
FIG. 1 is a block diagram of a computer system in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a block diagram of a computer system 10, is provided. The computer system 10 includes a microprocessor 15, which may include multiple processors (not shown), coupled to a host bus 20. A system memory controller 25 is coupled to the host bus 20 and a memory device 30. A host bridge 35 couples the host bus 20 to a primary bus 40, such as a peripheral component interconnect (PCI) bus (PCI Specification, Rev. 2.1). A video controller 45 and other devices 50 (e.g., PCI devices) are coupled to the primary bus 40. The computer system 10 may include other buses such as a secondary PCI bus (not shown) or other peripheral devices (not shown) known in the art.

The microprocessor 15 communicates with the memory device 30 through the system memory controller 25. The system memory controller 25 provides memory addresses and logic signals to the memory device 30 to characterize the desired memory transactions. In the illustrated embodiment, the memory device 30 is a synchronous dynamic random access memory (SDRAM) having block write functionality. The block writes may be accomplished in a bursting fashion. Although the present invention is described in reference to an SDRAM, its application is not so limited. In light of the disclosure herein, the present invention may be adapted for use with other types of memory devices (not shown).

Figure 2:
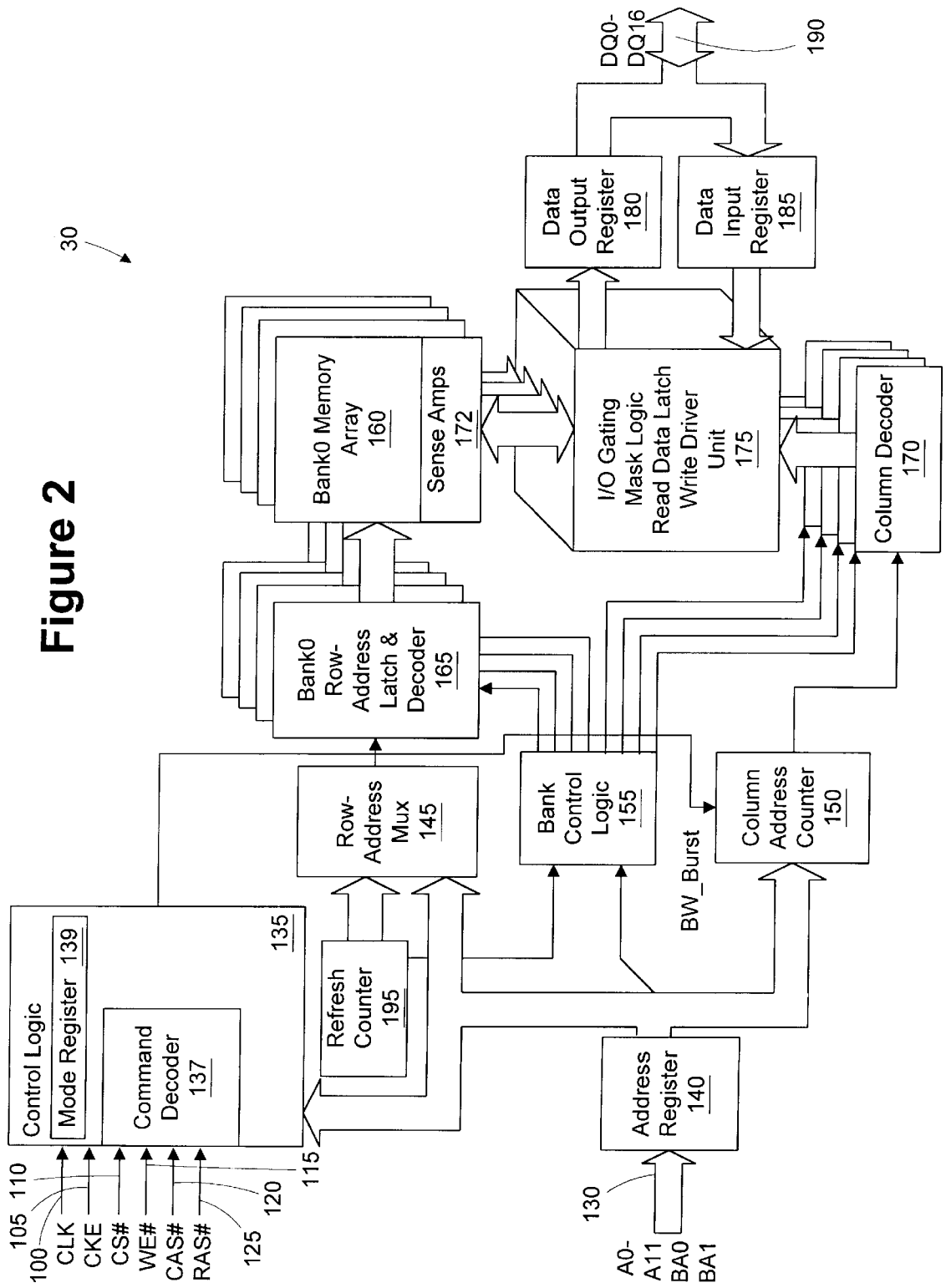
FIG. 2 is a block diagram of a memory device in the computer system of FIG. 1.

FIG. 2 illustrates a block diagram of the memory device 30. In the illustrated embodiment, the memory device 30 is burst oriented. Read and write accesses start at a selected location and continue for a programmed number of locations in a programmed sequence. The burst may terminate after a predetermined number of cells are accessed, or the burst may continue indefinitely until a burst terminate command is received. The memory device is synchronized with the microprocessor 15 and the system memory controller 25 by a clock signal (CLK) received on an external clock line 100. Commands issued to the memory device 30 are synchronized with the CLK signal (e.g., commands are issued on the rising edge of the CLK signal).

The memory device 30 receives logic signals from the system memory controller 25. As used herein, a pound sign (#) suffix on a logic signal name indicates that the logic signal is asserted low (i.e., a logic 0 indicates assertion, a logic 1 indicates de-assertion). The logic signals include a clock enable (CKE) signal on an external line 105, a chip select signal (CS#) on an external line 110, a write enable signal (WE#) on an external line 115, a column address select signal (CAS#) on an external line 120, and a row address select signal (RAS#) on an external line 125. The memory device 30 receives address information on external address lines 130. The address information includes twelve address bits (A0–A11) and two bank select bits (BA0 AND BA1).

Control logic 135 receives the CKE, CLK, CS#, WE#, CAS#, and RAS# signals. A command decoder 137 within the control logic 135 receives the CS#, WE#, CAS#, and RAS# signals and determines the desired command based on the logical combination of the signals. Using specific combinations of signals to define commands for accessing the memory device 30 is well known to those of ordinary skill in the art. The memory device 30 includes a mode register 139 that may be accessed by a load mode register command. The mode register includes information regarding the current operating mode of the memory device 30. For example, parameters such as latency, burst length, and write type (e.g., block vs. normal) may be stored in the mode register 139.

The memory device 30 also includes an address register 140 adapted to receive the address information on the external address lines 130. The address information includes row information and column information (received during successive cycles), which are stored in a row address multiplexer 145 and a column address counter 150, respectively. The bank select bits, BA0, BA1 are received by bank control logic 155. The column address counter 150 latches the column information provided on the external address lines 130 and increments the column address stored therein during each clock cycle to perform a burst operation. A burst may terminate after a predetermined number of cycles or after receipt of a burst terminate command.

In the illustrated embodiment, the memory device 30 includes four bank memory arrays 160 (Bank0 through Bank4). Each bank memory array 160 has an associated bank row address latch and decoder 165 and a column decoder 170. Each bank memory array 160 also includes sense amplifiers 172 for accessing the array 160. The bank row address latch and decoder 165 receives row information from the row address multiplexer 145, and the column decoder 170 receives column information from the column address counter 150. The bank control logic 155 selects one of the four bank memory arrays 160 based on the BA0 and BA1 address information and controls the bank row address latch and decoder 165 and column decoder 170 associated with the selected bank memory array 160.

An I/O gating, mask logic, read data latch, and write driver unit 175 interfaces with the bank memory arrays 160 and the column decoders 170 to coordinate data input and output. Data being read from the bank memory arrays 160 are stored in a data output register 180 and data being written to the bank memory arrays 160 are stored in a data input register 185. The memory device 30 includes external DQ lines 190 coupled to the data output register 180 and the data input register 185. A refresh counter 195 is coupled to the row address multiplexer 145 and the bank control logic 155 for refreshing the rows in the bank memory arrays 160.

The memory device 30 is adapted to operate in two different write modes, a normal write mode and a block write mode. The particular mode may be specified by loading the mode register 139 with mode information specifying the write mode, or alternatively, different external commands (i.e., defined by a combination of the external logic signals, CAS#, RAS#, and WE#).

During normal write mode, row and column addresses for a specific cell (not shown) in the bank memory array 160 are provided on the external address lines 130 while the command is being issued to the control logic 135. The column address is latched by the column address counter 150. The cell (not shown) is accessed and the column address counter 150 is incremented to point to the next column within the bank memory array 160. Subsequent cells are accessed on sequential clock cycles in a burst fashion until a predetermined number of cycles have been completed (e.g., 1, 2, 4, 8, or a full page) or until a burst terminate command is received by the control logic 135.

In the normal write mode, the CKE signal on the external lines is only used to specify the refresh type (e.g., auto refresh or self refresh) used for maintaining the values stored in the bank memory arrays 160. In self refresh mode, the CKE signal is deasserted (i.e., held to a logically low level) to disable the external clock. The memory device 30, using the refresh counter 195 performs its own internal clocking for refreshing the bank memory arrays 160.

During the block write mode, the same data value is written concurrently to multiple columns (not shown) in a row (not shown). In the illustrated example eight columns are written during a block write. However, it is contemplated that other block sizes, such as but not limited to 2, 4, 16, 32, etc. may be written during the block write. The number of columns (not shown) depends on the specific design requirements for the memory device 30.

To accomplish a block write, the eight columns are addressed by the most significant bits of the column address (i.e., when counting by eight in a binary system, the two least significant bits are ignored). The column address counter 150 is incremented by eight during each subsequent clock cycle to accomplish a burst access. The values on the external DQ lines 190 may be changed for each successive block write in the burst. The operation of the column address counter 150 is described in greater detail below in reference to FIG. 4.

Figure 3:
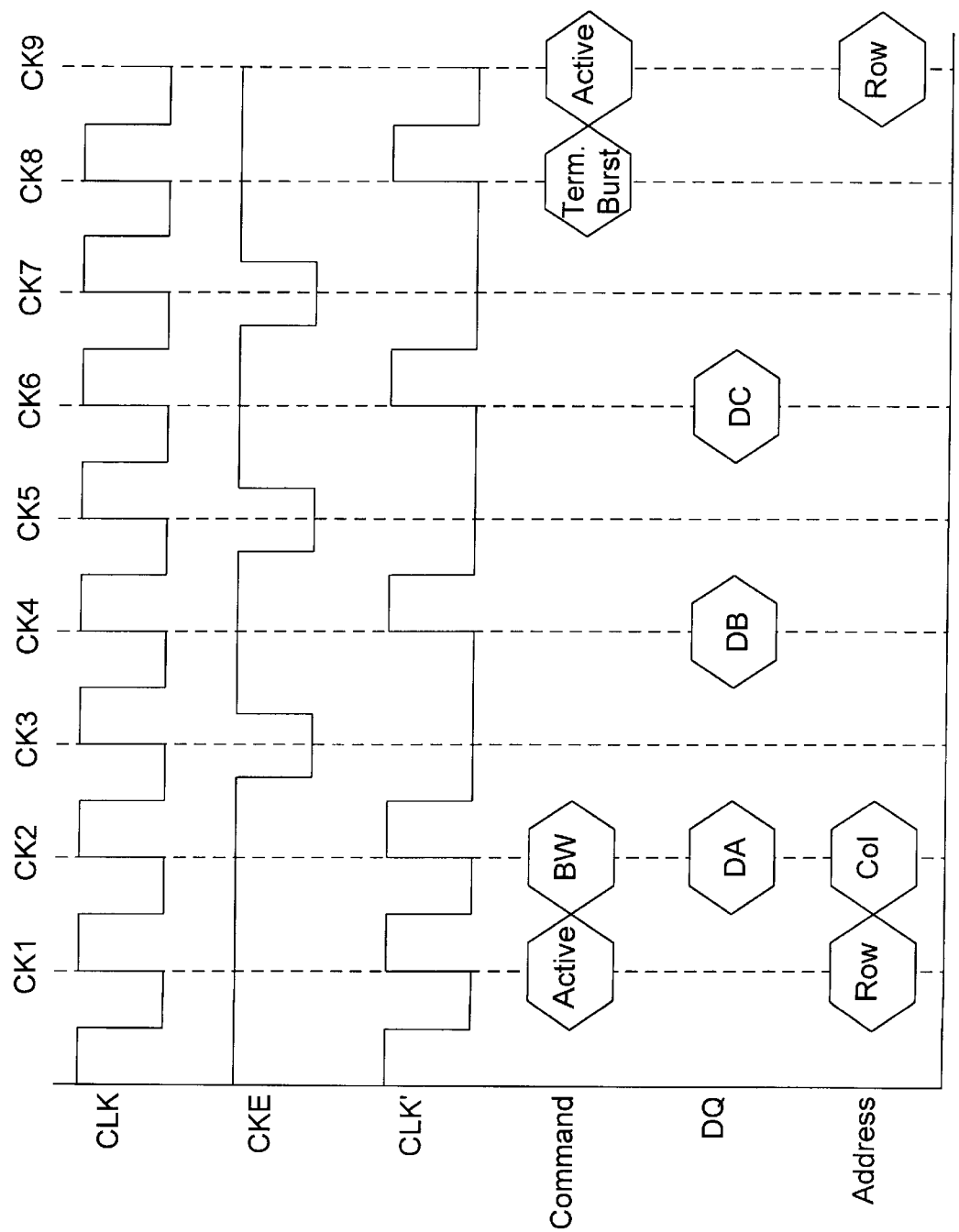
FIG. 3 is a timing diagram illustrating the operation of the memory device of FIG. 2 during a block write burst.

FIG. 3 is a timing diagram illustrating the operation of the memory device 30 during a block write burst. For ease of illustration ideal timing signals are used. Those of ordinary skill in the art will realize that an actual implementation will account for the transition times for the logic signals. It is assumed that a command has been previously executed to access the mode register 139 and place the memory device 30 into block write mode. In block write mode all write commands received by the control logic 135 are interpreted as block writes. Alternatively, a special command may be used to specify a block write vs. a normal write.

Referring to FIG. 3, an active command is received by the command decoder 137 on the clock cycle CK1. The row address (including bank number) is received on the external address lines 130. At cycle CK2, the block write command, column address, and the data (DA) to be written to the bank memory array 160 are received. The column address is latched in the column address counter 150. The eight columns addressed by the most significant bits of the column address stored in the column address counter 150 are concurrently accessed.

Because the block write requires more time to complete than a normal write, the normal equilibrate pulse that is typically provided each clock cycle is repressed. To accomplish this function, the CKE signal on the external line 105 is deasserted during the clock cycle CK3 occurring during the block write to suspend the external CLK signal. Because the external CLK signal is suspended, none of the components within the memory device 30 see the clock edge occurring at cycle CK3. The internal clock signal CLK' illustrates the actual clock signal seen by the internal components of the memory device 30. Accordingly, the write drivers in the I/O gating, mask logic, read data latch, and write driver unit 175 connected to and driving the sense amplifiers 172 continue to operate during the clock cycle CK3 to improve the speed of the write. The control logic 135 does not issue the equilibrate pulse because it does not receive the clock edge of the cycle CK3. Also, the column address counter 150 does not increment, so its value corresponds to the correct group of columns being accessed. Because the command decoder 137 does not receive the clock edge, it cannot inadvertently latch in an other command in the middle of the block write.

During the clock cycle CK4, the control logic 135 provides a block write burst signal (BW_burst) to the column address counter 150 to increment the column address counter 150 by eight to address the next eight columns. The data (DB) to be written during the next block write is provided on the external DQ lines 190. Again, during the intermediate clock cycle CK5, the CKE signal is deasserted to suppress the equilibrate pulse, hold the sense amplifiers 172, and prevent the column address counter 150 from incrementing.

The block write burst continues in a similar manner with the data DC being written in clock cycles CK6 and CK7. At the clock cycle CK8, a burst terminate command is received by the control logic 135 and the burst is stopped. A load mode register command could then be issued to change to the normal write mode. Alternatively, a new block write command having a different starting address could be issued to the control logic 135.

Figure 4:
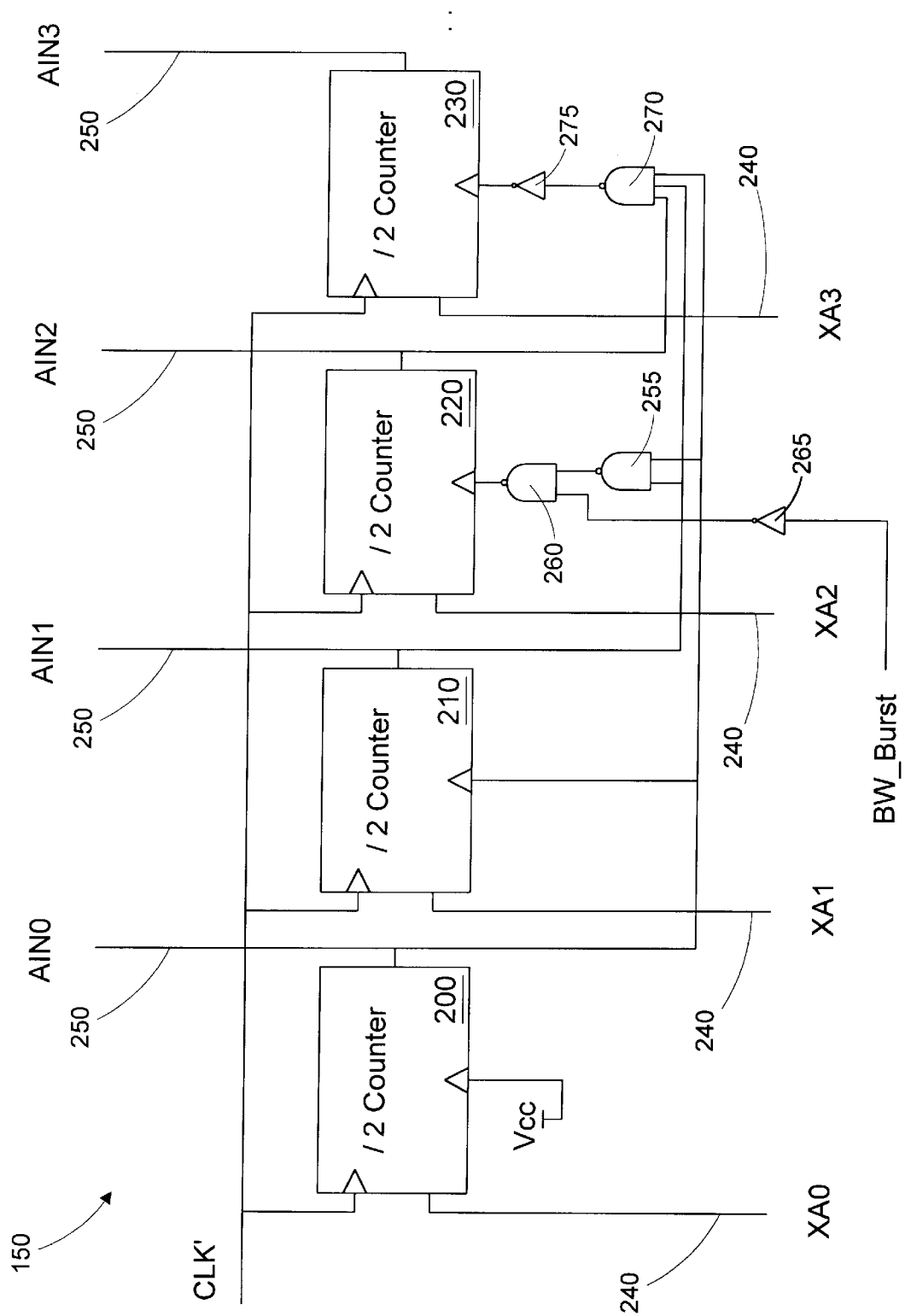
FIG. 4 is a block diagram of a column address counter of the memory device of FIG. 2.

Turning now to FIG. 4, a block diagram of the column address counter 150 is provided. The column address counter 150 includes four counter stages 200, 210, 220, and 230. For clarity and ease of illustration, only the four least significant bits are illustrated. Those of ordinary skill in the art will realize that the column address counter 150 will have a number of stages equal to the number of column address bits. Each counter stage 200, 210, 220, 230 receives the internal clock signal CLK' as its clock input. Accordingly, counters 200, 210, 220, 230 are not incremented while the external CLK signal is suspended (as described above in reference to FIG. 3).

The counter stages 200, 210, 220, 230 have input lines 240 (XA0 through XA3) for latching the external column address received on the address lines 130 coincident with an external command (e.g., read, write, or block write). The counter stages 200, 210, 220, 230 also include output lines 250 (AIN0 through AIN3) for providing the column address to the column decoder 170. After being loaded with a starting column address on the input lines 240, the counters 200, 210, 220, 230 are incremented on subsequent cycles of the CLK' signal to address the next subsequent column for a burst access. The toggle input for the first stage 200 is tied to a voltage source, Vcc and thus is toggled on every cycle of the CLK' signal. The output line 250 associated with the first counter stage 200 is coupled to the toggle input of the second stage 210 to increment the second counter stage 210 in a ripple fashion.

The third and fourth counter stages 220, 230 are coupled in a look-ahead fashion to increase the overall speed of the column address counter 150. The output lines 250 of the first and second counter stages 200, 210 are received by a NAND gate 255. The output of the NAND gate 255 is received by a second NAND gate 260. The NAND gate 260 also receives the BW_Burst signal from the control logic 135 through an inverter 265. The NAND gate 260 is coupled to the toggle input of the third counter stage 220. When both output lines 250 of the first and second stages 200, 210 go to a logically high level, the NAND gates 255, 260 provide a toggle signal to the third counter stage 220.

The output lines 250 of thee first, second, and third counter stages 200, 210, 220 are received by a NAND gate 270. The output of the NAND gate 270 is coupled to the toggle input of the fourth counter stage 230 through an inverter 275. When the output lines 250 of the first, second, and third stages 200, 210, 220 go to a logically high level, the NAND gate 270 and inverter 275 provide a toggle signal to the fourth counter stage 230. Successive counter stages (not shown) for the most significant bits may be coupled in a ripple, a partial look-ahead, or full look-ahead fashion, as is well known in the art.

The NAND gate 260 will also provide a toggle signal to the third counter stage 220 upon receiving the BW_Burst signal from the control logic 135. The control logic 135 sends the BW_Burst signal coincident with each block write in a burst to increment the third counter stage 220. In this manner, the column address counter 150 is incremented by eight upon the receipt of each BW_Burst signal. Incrementing the column address counter 150 by eight keeps the column address counter 150 synchronized with the columns being accessed during the block write burst. The specific counter stage 200, 210, 220, 230 coupled to receive the BW_Burst signal may vary with the block write size. For example, if the block write size were to be 16 columns, the fourth counter stage 230 would be coupled to receive the BW_Burst signal.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A memory device, comprising:
   a memory array arranged in rows and columns;
   an external clock terminal adapted to receive an external clock signal, the external clock signal having at least a first cycle and a second cycle, the first cycle including a first edge and the second cycle including a second edge;
   control logic coupled to the memory array and the external clock terminal and adapted to write to a first plurality of the columns in a specified row during the first and second cycles, wherein the control logic is further adapted to suspend the external clock signal to suppress the second edge of the second cycle while writing to the first plurality of the columns.

2. The memory device of claim 1, further comprising an external command terminal adapted to receive a first logic signal, wherein the control logic is adapted to suspend the external clock signal based on the first logic signal.

3. The memory device of claim 2, wherein the first logic signal comprises a clock enable signal.

4. The memory device of claim 1, wherein the control logic is adapted to operate in one of a block write mode and a normal write mode.

5. The memory device of claim 4, further comprising a mode register adapted to store mode information, wherein the control logic is adapted to operate in one of the block write and the normal write modes based on the mode information.

6. The memory device of claim 4, further comprising external command terminals adapted to receive an external command, wherein the control logic is adapted to operate in one of the block write and the normal write modes based on the external command.

7. The memory device of claim 1, further comprising a counter including a plurality of counter stages and adapted to store a first column address, the first column address corresponding to the first plurality of columns.

8. The memory device of claim 7, wherein the external clock signal has at least a third cycle and a fourth cycle, the third cycle includes a third edge, the fourth cycle includes a fourth edge, the control logic is adapted to write to a second plurality of the columns in the specified row during the third and fourth cycles, and the control logic is further adapted to suspend the external clock signal to suppress the fourth edge of the fourth cycle while writing to the second plurality of the columns.

9. The memory device of claim 8, wherein the first plurality of columns include N columns, and the counter is adapted to increment by $2^N$ in response to the third edge to generate a second column address, the second column address corresponding to the second plurality of columns.

10. The memory device of claim 9, wherein the control logic is adapted to provide a block write burst signal to the counter coincident with the third edge.

11. The memory device of claim 10, wherein the counter includes at least N counter stages, each counter stage has a toggle input, and the toggle input of the $N^{th}$ counter stage is coupled to receive the block write burst signal.

12. The memory device of claim 9, where N is at least four.

13. The memory device of claim 7, wherein the external clock signal has at least J pairs of cycles, each pair includes a leading cycle and a trailing cycle, the control logic is adapted to write to J pluralities of the columns in the specified row during the J pairs of cycles, and the control logic is further adapted to suspend the external clock signal to suppress the trailing cycles while writing to each of the J pluralities of the columns.

14. The memory device of claim 13, wherein J is an integer value greater than 1.

15. The memory device of claim 13, wherein each of the J pluralities of columns include N columns, and the counter is adapted to increment by $2^N$ in response to each of the leading cycles to generate a plurality of column addresses, each of the plurality of column addresses corresponding to one of the J pluralities of columns.

16. The memory device of claim 13, further comprising a mode register adapted to store mode information, wherein the mode information includes the integer value of J.

17. A computer system, comprising:
   a microprocessor adapted to issue a plurality of memory requests;
   a memory controller coupled to the microprocessor and adapted to receive the memory requests and generate memory access commands based on the memory requests, the memory access commands including a block write command;
   a memory device coupled to the memory controller and adapted to receive the memory access commands, the memory device including:
      a memory array arranged in rows and columns;
      an external clock terminal adapted to receive an external clock signal, the external clock signal having at least a first cycle and a second cycle, the first cycle including a first edge and the second cycle including a second edge;
      control logic coupled to the memory array and the external clock terminal and adapted to write to a first plurality of the columns in a specified row during the first and second cycles in response to the block write command, wherein the control logic is further adapted to suspend the external clock signal to suppress the second edge of the second cycle while writing to the first plurality of the columns.

18. The computer system of claim 17, further comprising an external command terminal coupled to the memory controller, the memory controller being adapted to provide a first logic signal to the external command terminal, wherein the control logic is adapted to suspend the external clock signal based on the first logic signal.

19. The memory device of claim 18, wherein the first logic signal comprises a clock enable signal.

20. The memory device of claim 17, further comprising a counter including a plurality of counter stages and adapted to store a first column address, the first column address corresponding to the first plurality of columns.

21. The memory device of claim 20, wherein the external clock signal has at least a third cycle and a fourth cycle, the third cycle includes a third edge, the fourth cycle includes a fourth edge, the control logic is adapted to write to a second plurality of the columns in the specified row during the third and fourth cycles, and the control logic is further adapted to suspend the external clock signal to suppress the fourth edge of the fourth cycle while writing to the second plurality of the columns.

22. The memory device of claim 20, wherein the first plurality of columns include N columns, and the counter is adapted to increment by $2^N$ in response to the third edge to generate a second column address, the second column address corresponding to the second plurality of columns.

23. The memory device of claim 21, wherein the control logic is adapted to provide a block write burst signal to the counter coincident with the third edge.

24. The memory device of claim 23, wherein the counter includes at least N counter stages, each counter stage has a toggle input, and the toggle input of the $N^{th}$ counter stage is coupled to receive the block write burst signal.

25. A method for accessing a memory device arranged in rows and columns, comprising:

receiving an external clock signal, the external clock signal having at least a first cycle and a second cycle, the first cycle including a first edge and the second cycle including a second edge;

writing to a first plurality of columns in a specified row during the first and second cycles; and suspending the external clock signal to suppress the second edge of the second cycle while writing to the first plurality of the columns.

26. The method of claim 25, the memory device including a counter, the method further comprising storing a first column address in the counter, the first column address corresponding to the first plurality of columns.

27. The method of claim 26, further comprising incrementing the counter in the memory device by the number of columns in the first plurality of columns to generate a second column address.

28. The method of claim 27, further comprising writing to a second plurality of columns in the specified row based on the second column address.

29. The method of claim 28, wherein the external clock signal has at least a third cycle and a fourth cycle, the third cycle includes a third edge, the fourth cycle includes a fourth edge, and the method further comprises:

writing to the second plurality of columns in the specified row during the third and fourth cycles; and suspending the external clock signal to suppress the fourth edge of the fourth cycle while writing to the second plurality of columns.

30. The method of claim 29, wherein incrementing the counter includes incrementing the counter in response to the third edge.

31. A memory device, comprising:

means for storing data arranged in rows and columns;

means for receiving an external clock signal, the external clock signal having at least a first cycle and a second cycle, the first cycle including a first edge and the second cycle including a second edge;

means for writing to a first plurality of columns in a specified row during the first and second cycles; and means for suspending the external clock signal to suppress the second edge of the second cycle while writing to the first plurality of the columns.

* * * * *

UNITED STATES PATENT AND TRADEMARK OFFICE
CERTIFICATE OF CORRECTION

PATENT NO. : 6,192,002 B1  
DATED : February 20, 2001  
INVENTOR(S) : Todd A. Merritt Page 1 of 1

It is certified that error appears in the above-identified patent and that said Letters Patent is hereby corrected as shown below:

<u>Title page,</u>  
Delete Title "MEMORY DEVICE WITH COMMAND BUFFER" and replace with -- MEMORY DEVICE WITH BLOCK WRITE BURST --.

Signed and Sealed this

Twenty-ninth Day of January, 2002

Attest:

JAMES E. ROGAN  
*Attesting Officer*     *Director of the United States Patent and Trademark Office*